United States Patent [19]

Blazic et al.

[11] Patent Number: 5,032,246
[45] Date of Patent: Jul. 16, 1991

[54] SPUTTERING TARGET WRENCH AND SPUTTERING TARGET DESIGN

[75] Inventors: Martin L. Blazic, Bexley, Ohio; Roy A. Calligaro, Richardson, Tex.

[73] Assignee: Tosoh SMD, Inc., Grove City, Ohio

[21] Appl. No.: 524,607

[22] Filed: May 17, 1990

[51] Int. Cl.$^5$ .............................................. C23C 14/34
[52] U.S. Cl. ............................ 204/298.12; 204/298.18
[58] Field of Search ....................... 204/192.12, 298.12, 204/298.18

[56] References Cited

U.S. PATENT DOCUMENTS

| | | | |
|---|---|---|---|
| 4,100,055 | 7/1978 | Rainey | 204/298.12 |
| 4,385,979 | 5/1983 | Pierce et al. | 204/298.09 |
| 4,457,825 | 7/1984 | Lamont, Jr. | 204/298.12 |
| 4,564,435 | 1/1986 | Wickersham | 204/298.12 |
| 4,657,654 | 4/1987 | Mintz | 204/298.12 |
| 4,668,373 | 5/1987 | Rille et al. | 204/298.12 |
| 4,820,397 | 4/1989 | Fielder et al. | 204/298.12 |
| 4,855,033 | 8/1989 | Hurwitt | 204/298.09 |
| 4,885,075 | 12/1989 | Hillman | 204/298.09 |

FOREIGN PATENT DOCUMENTS 63-72874 4/1988 Japan ............................. 204/298.18
2173217A 10/1986 United Kingdom ........... 204/298.12

Primary Examiner—Aaron Weisstuch
Attorney, Agent, or Firm—Biebel & French

[57] ABSTRACT

A cathode sputtering mechanism is disclosed having a target nest and a target located within the target nest. The target nest includes a threaded internal peripheral surface which is complementary to external threads on the outer peripheral surface of the target. The target also includes a central opening having a tapered upwardly facing surface having apertures extending vertically into the tapered surface. A removal wrench includes a cylindrical ring having at its lower end a tapered surface which matches the tapered surface on the target. The wrench also includes torque pins extending into the tapered surface of the cylindrical ring which are disposed in complementary spacial relationship with the apertures in the target.

24 Claims, 2 Drawing Sheets

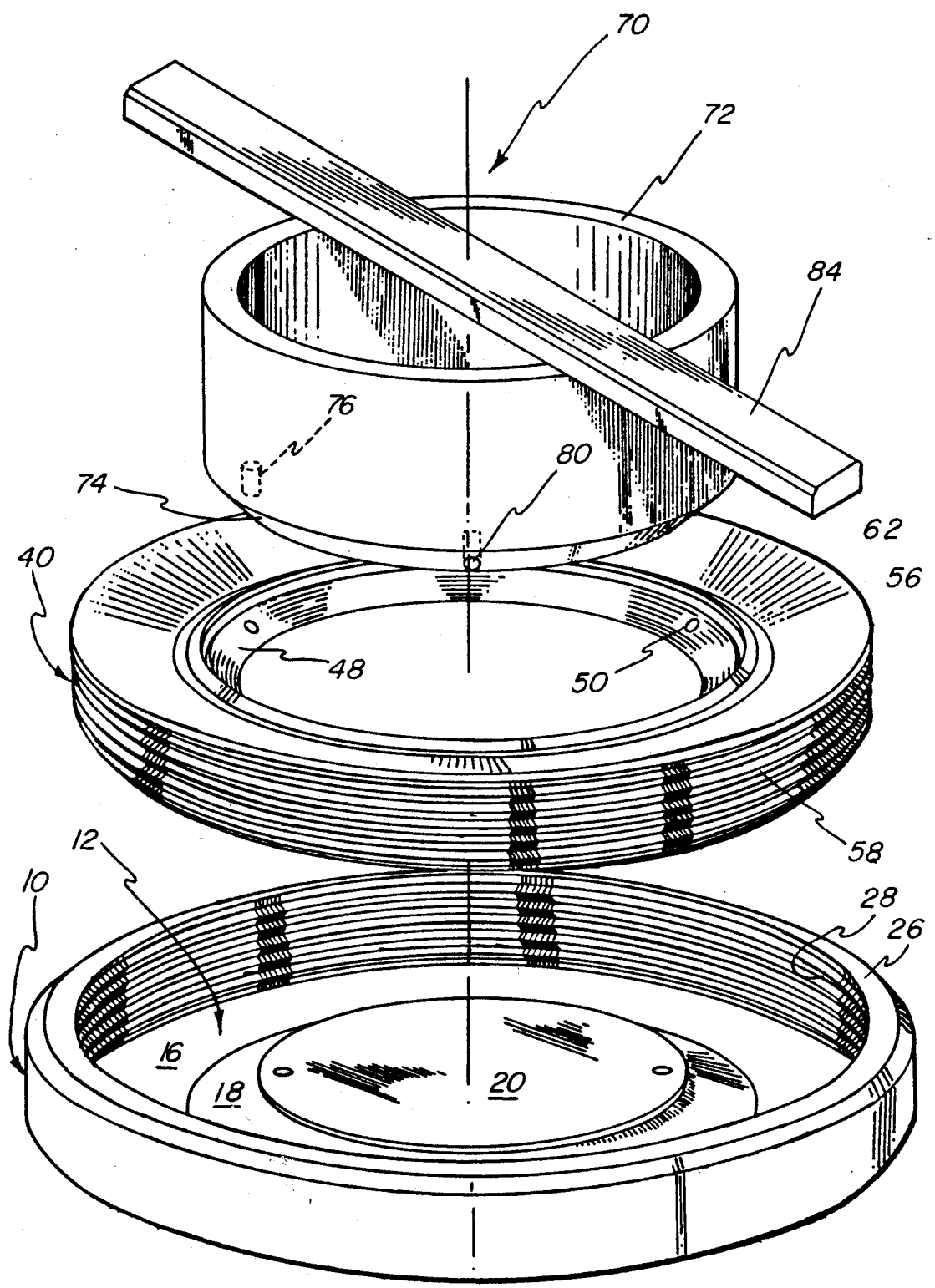

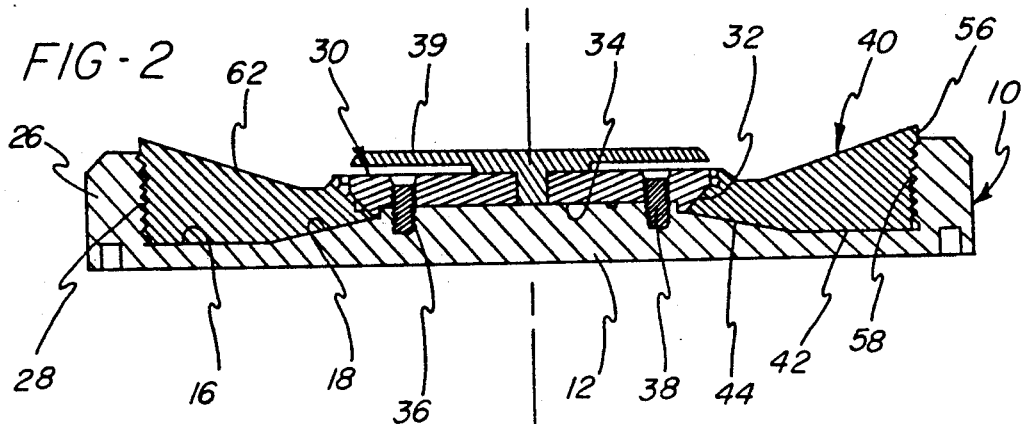
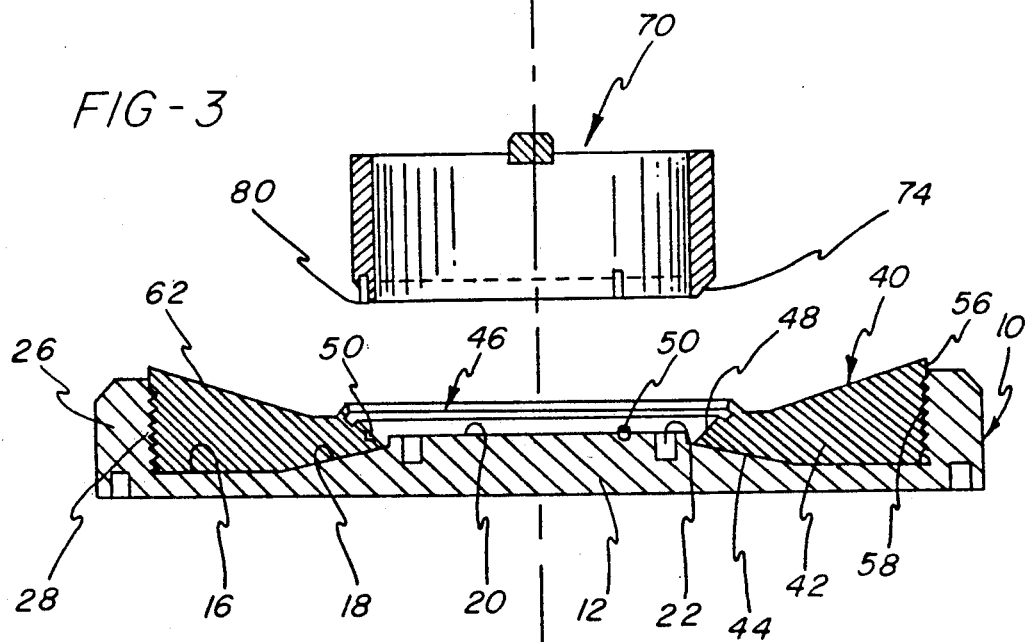
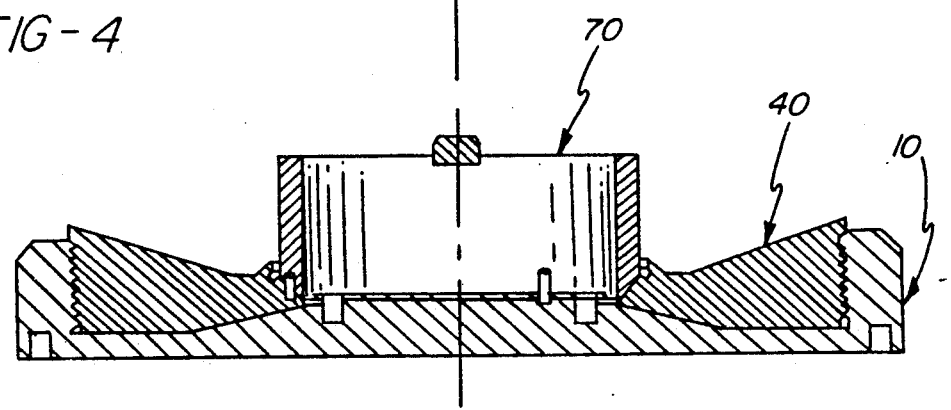

SPUTTERING TARGET WRENCH AND SPUTTERING TARGET DESIGN

BACKGROUND OF THE INVENTION

Sputtering as a means to deposit thin films of a desired material on a substrate has become important in the manufacture of semiconductor devices such as integrated circuits. In a sputtering system, material to be deposited on a substrate is removed from a sputter target by bombardment of the target with ions. However, ion bombardment not only causes atoms or molecules of the target material to be ejected from the target, it also imparts thermal energy to the target.

Normally, a sputtering system comprises a sputter source, a vacuum chamber, and means for positioning and holding the substrate in proximity to the sputter source. The sputter source normally comprises a target from which material is to be sputtered, means for holding the target in place, means for creating a plasma in the vicinity of the target, means for causing ions in the plasma to bombard the target, and means for cooling the target to prevent overheating.

Various means have been used in the past for holding sputter targets in place within the sputter sources. Such holding means must insure that the target maintains good thermal contact with the cooling means. In a vacuum environment this generally requires good physical contact. On the other hand, sputter targets must be replaced from time to time as the target material is removed and the target has eroded away. Moreover, in certain research applications there is the need for frequent target changes so that experiments can proceed with different materials.

The time required to replace the sputter target and the method of replacement are often significant considerations to users of sputtering systems. For example, the semiconductor manufacturing industry is particularly sensitive to equipment down time because of the disruptive and costly effects it can have on an entire semiconductor fabrication line. Similarly, the method of target replacement should minimize the introduction of foreign material into the sputtering system vacuum chamber to avoid possible contamination problems with the substrate.

In some prior art sputter sources, the sputter target is physically soldered to a cooling plate. While this insures good thermal contact, it makes replacement of the target a difficult and time consuming problem. In other designs, targets are physically bolted to a cooling means. While this makes target replacement somewhat easier, the thermal contact is not as good.

Other sputter sources have annular targets where cooling is accomplished by thermal contact between an outer rim of the target and a peripheral cooling wall. In such sources, good thermal contact is maintained between the target rim and the cooling wall by thermal expansion of the target. Examples of such sources are shown in U.S. Pat. Nos. 4,100,055; 4,385,979; 4,457,825 and 4,657,654.

In a more recent design, for example, as shown in U.S. Pat. No. 4,855,033 a sputtering target cathode includes a cathode nest which receives the target. The cathode nest includes internal helical threads on its inner peripheral surface, while the target includes helical threads on its outer periphery which match the threads in the target nest. The target includes a central aperture formed by a sloped surface which receives a retainer. Screws are insertable through apertures in the retainer to retain a target within the target nest.

As mentioned earlier, the ion bombardment imparts thermal energy to the target causing the target to thermally expand. In a situation where the target is internally threaded into the target nest, for example as shown in U.S. Pat. No. 4,855,033, the thermal expansion of the target makes it quite difficult for the removal of the target, even after the target has cooled.

Prior methods of removing targets include using such tools as a hammer and chisel and tapping at the target in an opposite sense to "unscrew" the target out of its complementary target nest. This method has proven to be very time consuming in the changeover of targets, and can also introduce foreign material into the vacuum chamber causing possible contamination problems with the substrate. Moreover, damage to the target nest or other expensive sputtering equipment may occur.

Accordingly, it is an object of the invention to make it possible to quickly and easily change sputter targets in a sputter source of the type where the sputtering target is of the type having helical threads on the outer periphery of the target.

Another object of the invention is to provide a quick change sputter target and source structure which minimizes the risk of contamination of the sputter system vacuum chamber and damage to the system equipment.

Other objects and advantages of the invention will be apparent from the following description, the accompanying drawings and the appended claims.

SUMMARY OF THE INVENTION

The above mentioned objects are accomplished by providing improvement in a sputtering target assembly comprising a target nest having internal threads on an inside annular surface thereof that are adapted to mate with external threads provided on the exterior periphery of the target. Apertures are also included in an upper face of the target. The sputtering target assembly further includes a target wrench having a base section comprising torque pins extending downwardly therefrom where the torque pins are profiled with the same spacial relationship as the apertures, and are therefore adapted to extend into and engage the apertures, for removal of the target.

By the provision of the apertures in the upper face of the target, a complementary target wrench can be placed over the target. Torque can then be easily applied to the wrench to remove the target, without the risk of contaminating the vacuum chamber, and further eliminating the need to chisel the target for removal.

An inventive method of removing a sputtering target from a target nest in a cathode sputtering mechanism having a cathode, a target nest and a target located within the target nest, comprises the steps of providing internal threads on the inner annular surface of the target nest, and providing external threads on the exterior periphery of the target. Apertures are also provided in an upper face of the target. A wrench is provided having a base section comprising torque pins extending downwardly therefrom where the torque pins are profiled with the same spacial relationship as the apertures in the target nests. The method also includes the step of placing the wrench over the target with the torque pins in the apertures and rotating the wrench. In this manner, the target is rotated in the direction of the wrench for easy insertion or removal of the target within the cathode sputtering mechanism.

BRIEF DESCRIPTION OF THE DRAWINGS

FIG. 1 is an isometric view of the target wrench positioned above the sputtering target and target nest.

FIG. 2 is a cross-sectional view through the target and target nest, showing the retaining ring in place.

FIG. 3 is a cross-sectional view similar to that of FIG. 2, showing the shroud and the retaining ring removed and the wrench positioned above the target.

FIG. 4 is a view similar to that of FIG. 3 showing the target wrench inserted into the target for removal of the target.

DETAILED DESCRIPTION OF THE PREFERRED EMBODIMENT

With reference first to FIG. 1, the target nest 10 is circular in configuration and includes a lower floor portion 12 having a flat section 16 contiguous with a sloping or tapered surface 18, and further includes a central circular platform 20. The target nest 10 further comprises a continuous upstanding wall 26 extending from the floor section 12 which forms a circular peripheral ring around the floor portion 12. The inner peripheral surface of the upstanding wall 26 has helical threads 28 for receiving a complementary threaded outer wall of target 40.

With reference now to FIG. 3, the target 40 includes a lower flat surface 42 which is profiled to lie against complementary surface 16 of the target, and further includes an upwardly sloping surface 44 which lies adjacent to the complementary surface 18 of the target nest. The target 40 also includes an outer peripheral wall or surface 56 having external helical threads 58 that are complementary with the internal threads 28 on the target nest 10. The target 40 also includes an upper surface 62 carrying the source material to be sputtered.

As shown in FIG. 3, the target 40 includes a central opening 46 which overlies the circular platform 20. The opening 46 is formed by a tapered surface 48 forming a frusto-conical surface extending around the opening 46 of the target 40. The tapered surface 48 also includes apertures 50 extending vertically into the surface, but preferably the apertures 50 do not extend through to the tapered surface 44 on the lower opposite side of the target 40.

As shown in FIG. 2, the target assembly further comprises a retaining ring 30 having a tapered surface 32 which is complementary with the tapered surface 48 (FIG. 3) of the target. The retainer ring 30 also includes a lower surface 34 profiled to lie adjacent to the floor 20 (FIG. 3) of the target nest 10, and apertures 36 alignable with tapped apertures 22 (FIG. 3) of the target net 10. Fasteners such as 38 are also included which are engageable with the tapped apertures 36. A shroud 39 is attached to the retaining ring 30 to cover the fasteners 38, to keep them free of sputtered deposition.

With reference now to FIG. 1, the target wrench 70 includes a cylindrical ring or base section 72 having a torque handle 84 attached to the top of the base section 72. The lower surface of the base section 72 includes a tapered surface 74 which too forms a frusto-conical surface, complementary with the tapered surface 48 of the target. The wrench 70 also includes pin apertures 76 extending vertically into the tapered surface 74 carrying torque pins 80 which are disposed in a complementary spatial relationship with the apertures 50 in the target.

In practice then, the sputtering target assembly is configured as shown in FIG. 2 with the target 40 threaded into place within the target nest 10, such that the lower surface 42 abuts the floor 16 of the target nest. The retaining ring 30 also overlies the target 40, with the fasteners 38 tightened within the tapped apertures 36 to urge the complementary surface 32 and 48 into engaging contact. It should be noticed that with the retaining ring 30 in place as described above, the surface 48 and, in particular the apertures 50, are located on a non-sputtering area of the target.

When a spent target 40 is to be removed from its complementary target nest 10, the retaining ring 30 is first removed from the assembly by removing the shroud 39 and then the fasteners 38 (FIG. 2). The wrench 70 is then placed over the target 40, as shown in FIg. 3, such that the tapered surface 74 resides on the tapered surface 48 of the target with the torque pins 80 projecting into complementary apertures 50 of the target. A torque is then applied to the wrench 70 unscrewing the target 40 from the complementary target nest 10.

While the wrench 70 has more merit in the removal of spent targets, the wrench 70 can also be used to install new targets. In this event, the threads 58 of the new target are placed into threadable engagement with the threads 28 of the target nest 10, and the tool 70 is torqued in the opposite sense to thread the target into the nest 10.

While the method herein described, and the form of apparatus for carrying this method into effect, constitute preferred embodiment of this invention, it is to be understood that the invention is not limited to this precise method and form of apparatus, and that changes may be made in either without departing from the scope of the invention, which is defined in the appended claims.

What is claimed is:

1. A sputtering target assembly, comprising:
   a target nest and a source target located within the target nest, the target having apertures located on an upper surface of the target;
   coupling means provided on said target and said nest for inserting and removing said target from said nest upon rotation of said target relative to said nest; and
   a target wrench having a base section comprising torque pins extending downwardly therefrom, the torque pins being adapted to engage said apertures in the target, and means to apply torque to the target wrench.

2. The assembly of claim 1, wherein the apertures are located on a non-sputtered surface of said target.

3. The assembly of claim 2, further comprising a retaining ring adapted to be received over the apertures, keeping the apertures free of sputtered deposition.

4. The assembly of claim 1, wherein the target has a central opening with a tapered face.

5. The assembly of claim 4, wherein the apertures are located within the tapered face.

6. The assembly of claim 5, wherein the base section comprises a cylindrical ring.

7. The assembly of claim 6, wherein the cylindrical ring is tapered at a lower edge to match the tapered face on the target.

8. The assembly of claim 7 wherein the torque pins are inserted within the tapered edge of the cylindrical ring.

9. The assembly of claim 6, wherein the torque means comprises an elongate handle fixed to the cylindrical ring.

10. A sputtering target assembly, comprising:
a target nest having internal threads on an inner annular surface thereof;
a target located within the target nest, the target having external threads on an exterior periphery of the target adapted for threadable engagement with the threads on the target nest, and apertures in an upper face of the target; and
a target wrench having a base section comprising torque pins extending downwardly therefrom, the torque pins being profiled with the same spacial relationship as the apertures, and means to apply torque to the target wrench.

11. The assembly of claim 10, wherein the target has a central opening with a tapered face.

12. The assembly of claim 11, wherein the apertures are located within the tapered face.

13. The assembly of claim 10, wherein the base section comprises a cylindrical ring.

14. The assembly of claim 13 wherein the cylindrical ring is tapered at a lower edge to match the tapered face on the target.

15. The assembly of claim 14 wherein the torque pins are inserted within the tapered edge of the cylindrical ring.

16. The assembly of claim 10, wherein the torque means comprises an elongate handle fixed to the cylindrical ring.

17. In a cathode sputtering mechanism having a cathode, a target nest and a target located within the target nest, and wherein coupling means are provided on said target and said nest for inserting and removing said target from said nest upon rotation of said target relative to said nest, a method of inserting or removing the target from the nest comprises the steps of:
providing apertures in an upper face of the target;
providing a tool having a base section comprising torque pins extending downwardly therefrom, the torque pins being adapted to engage said apertures in the target nest; and
placing the tool over the target with the torque pins in the apertures, and rotating the tool thereby causing said rotation of the target relative to the target nest.

18. The method of claim 17, further providing the step of forming the target with an inner annular bore.

19. The method of claim 18 further comprising the step of providing the annular bore with a tapered face.

20. The method of claim 19 further comprising the step of providing the apertures in the tapered face.

21. In a cathode sputtering mechanism having a cathode, a target nest and a target located within the target nest, a method of inserting or removing the target from the nest comprises the steps of:
providing internal threads on an inner annular surface of the target nest;
providing external threads on the exterior periphery of the target;
providing apertures in an upper face of the target;
providing a tool having a base section comprising torque pins extending downwardly therefrom, the torque pins being profiled with the same spacial relationship as the apertures in the target nest; and
placing the tool over the target with the torque pins in the apertures, and rotating the tool thereby causing the rotation of the target in the requisite direction.

22. The method of claim 21, further providing the step of forming the target with an inner annular bore.

23. The method of claim 22 further comprising the step of providing the annular bore with a tapered face.

24. The method of claim 23 further comprising the step of providing the apertures in the tapered face.

* * * * *